United States Patent [19]
Wilkins

[11] Patent Number: 6,058,068
[45] Date of Patent: May 2, 2000

[54] WRITE DRIVER WITH LOCALLY GENERATED RESET PULSE

[75] Inventor: James W. Wilkins, Boise, Id.

[73] Assignee: Micron Technology, Inc., Boise, Id.

[21] Appl. No.: 09/258,080

[22] Filed: Feb. 25, 1999

[51] Int. Cl.$^7$ ........................................... G11C 8/00
[52] U.S. Cl. ................................. 365/233; 365/194
[58] Field of Search ............................... 365/233, 194, 365/230.06, 230.08, 199, 189.01

[56] References Cited

U.S. PATENT DOCUMENTS 5,946,244   8/1999   Manning .................................. 365/233

*Primary Examiner*—David Nelms
*Assistant Examiner*—David Lam
*Attorney, Agent, or Firm*—Dorsey & Whitney LLP

[57] ABSTRACT

A synchronous memory device includes separate pulse generators to produce write recovery pulses locally for input to each local column selector. The local generation of the write recovery pulse eliminates a write recovery line extending from the control logic to each of the local write drivers thereby simplifying control of timing within the device. The local pulse generators provide pulses of the write recovery signal in response to the transition of a write data signal from the true to the not-true state.

25 Claims, 6 Drawing Sheets

WRITE DRIVER WITH LOCALLY GENERATED RESET PULSE

TECHNICAL FIELD

The present invention relates to memory devices, and more particularly, to control circuits for volatile memory arrays.

BACKGROUND OF THE INVENTION

As shown in FIG. 1, a prior art synchronous memory device 40, such as a synchronous static random access memory (SSRAM), includes as its central memory element a memory array 42 that contains memory cells arranged in rows and columns. The array 42 is divided into four quadrants $43_1$–$43_4$, each of which is divided in turn into eight segments 45. Each segment 45 includes 16 pairs of column lines intersected by several row lines, and the memory cells are coupled at intersections of the row and column lines.

A controller 44 controls reading from and writing to the array 42 in response to a clock signal CLK and commands READ, WRITE, as shown in the first and second diagrams of FIG. 2. The clock signal CLK and commands READ, WRITE are supplied at input terminals 47 from a source external to the memory device 40 such as a memory controller (not shown in FIG. 1). One skilled in the art will recognize that the commands READ, WRITE are actually a composite of signals, such as a row address strobe RAS*, a column address strobe CAS*, and a write enable signal $\overline{WE}$*.

Within the memory device 40, the controller 44 controls reading and writing by producing internal control signals such as a write recovery signal WR* and a write data signal WD*, in response to the commands READ, WRITE. As will be explained below, the write data signal WD* enables writing to the array, and the write recovery signal WR* initiates precharging and equilibration to prepare the array for subsequent reads or writes. One skilled in the art will recognize that the asterisks following the signals WR*, WD* indicate that the signals are low-true signals. That is, the signals WR*, WD* are low voltages when true.

In addition to the externally supplied command signals READ, WRITE and clock signal CLK, the memory device 40 also receives addresses AN from an address bus 46 at an address buffer 48 and receives and outputs data from a data bus 49 with input and output data latches 64, 66. The addresses AN received at the address buffer 48 may be row or column addresses. If an address is a row address, the address is stored in a row latch 52. The row latch 52, under control of the controller 44, then transmits the row address to a row decoder 62. The row decoder 62 decodes the row address and activates a corresponding row of the memory array 42 in response to the internal control signals from the controller 44 and the clock signal CLK, as will be discussed in greater detail below.

If the address $A_N$ is a column address, the address $A_N$ is stored in a column latch 50. The column latch 50 forwards the address $A_N$ to a column decoder 54. The column decoder 54 decodes the address $A_N$ and provides the decoded address to a column selector 60 in an I/O interface 56. In addition to the column selectors 60, the I/O interface also includes I/O elements such as sense amplifiers and precharge circuitry in a bank of driving circuits 58, where each driving circuit 58 corresponds to one segment 45 of the array 42. Each driving circuit 58 outputs signals to or receives signals from the respective column selector 60 on a respective pair of complementary data lines 76. In response to the decoded address $A_N$ from the column decoder 54, the column selector 60 couples the pair of data lines 76 to one of the 16 pairs of complementary digit lines in the corresponding segment 45.

In a read operation, a read command READ and an address $A_1$ specifying the location of data to be read are received at time $t_1$, as shown in FIG. 2. The logic controller 44 then determines that an operation is a read operation and outputs a word line signal WL to activate the addressed row line at time $t_2$, as shown in the fourth diagram of FIG. 2. Shortly thereafter, at time $t_3$, the column decoder 54 provides the decoded column address $A_1$ to the column selector 60, as shown in the fifth graph of FIG. 2. In response, the column selector 60 couples the corresponding pair of data lines 76 to one pair of digit lines. One skilled in the art will recognize that the row line and column line activated at times $t_2$, $t_3$, respectively, may correspond to an address and command received at a clock pulse preceding time $t_1$, depending upon the latency of the device 40. It is assumed for simplicity herein that the device is a two-latency device, so that the row and column signals WL, COL at times $t_2$, $t_3$ correspond to the row address, column address and write command present at time $t_1$.

At time $t_4$, the controller 44 activates the I/O interface 56 to cause the sense amplifiers to read the data on the selected digit line and provide the data to the output data buffer 66. At time $t_5$, the output data buffer 66 makes the output data available at the data bus 48.

In a write operation, a write command WRITE and an address $A_2$ specifying the location where data is to be stored are received at time $t_6$, as shown in FIG. 2. The controller 44 enables writing at time $t_7$ by providing a low write data signal WD* on a write data line 70. Then, at times $t_8$, $t_9$, respectively, the controller 44 activates the row decoder 62 to activate the corresponding row of the array 42 and activates the column decoder 54 to provide the column address to the column selector 60.

In response to the write data signal WD* and data from the input data buffer 64, one of the driver circuits 58 outputs data on its pair of data lines 76. The column selector 60 transfers the data from the pair of data lines 76 to one of the 16 pairs of digit lines in the corresponding segment 45. Because the corresponding row line is active, the data are written to the location in the memory array 42 corresponding to the address $A_2$.

After a sufficient time has elapsed for writing data, the column signal and row signal WL returns low at times $t_{10}$, $t_{11}$ to deactivate the column and row. Then, at time $t_{12}$ the write data signal WD* returns high (not true) to terminate writing by the local driver circuit 58. Shortly thereafter at time $t_{13}$, the controller 44 provides a low-going pulse of the write recovery signal WR* on a write recovery line 72. The pulse of the write recovery signal WR* activates precharge circuitry in the local driver circuit 58 to precharge the column lines. In response, the driver circuit 58 sets the data lines 76 high The high data lines 76 raise both digit lines in the pair to a high voltage, because the column selector 60 is still active. After the driver circuit 74 charges the data lines 76, the column selector 60 decouples the data lines 76 from the selected digit lines. The pair of digit lines are thus raised to high voltages to prepare for subsequent reading.

One problem with the above-described approach is that the write recovery signal WR* does not begin until the write data signal WD* ends. The controller 44 must therefore allow time between the end of the write data signal WD* and the arrival of the next clock pulse for the write recovery signal WR* to initiate recovery of the digit line voltages. If the controller 44 does not allow sufficient time for the write recovery signal WR*, the write recovery signal WR* may still be low after the end of the writing period (i.e., after the next leading edge of the clock CLK). Consequently, the driving circuit 58 may still be precharging the lines at the same time that the device is attempting to read data from the array 42. The precharging circuitry will thus write a cell to a high voltage, regardless of its original data.

Another problem with the prior art circuit shown in FIG. 1 arises from the distance traveled by the pulse of the write recovery signal WR* along the write recovery line 72 to the most distant driver circuit 58. As the pulse propagates, capacitive and resistive effects may limit the speed at which the pulse can raise the voltage of the driver circuits 58. The controller 44 must therefore provide the write recovery signal WR* for a sufficiently long period to raise the voltage at the most distant driver circuit 58 above a minimum value (typically a threshold voltage of a precharge or equilibration transistor). The overall clock period must be long enough to accommodate the write recovery signal WR* after the write data signal WD* goes high, thereby lowering the overall clock frequency.

SUMMARY OF THE INVENTION

A memory device includes a plurality of local write drivers that detect the end of a writing interval and produce write recovery pulses in response. By producing the write recovery pulses at the local write drivers, the memory device eliminates the need for the control logic to generate write recovery pulses, simplifying timing of signals within the memory device and eliminating several problems associated with differences in propagation times of pulses.

In one embodiment, the memory device includes a memory array divided into four quadrants each containing eight segments. Each of the eight segments contains sixteen pairs of column lines. The memory device operates under control of a control circuit that generates a write data signal to enable writing to the memory array.

Within the local write drivers, trailing edge detectors detect transition of the write data signal to a not true state and produce write recovery pulses in response. The write recovery pulses activate respective output drivers to produce recovery voltages on respective driver lines.

In response to a column address, a column selector couples the driver lines to corresponding column lines to apply the write recovery voltage to the appropriate column lines.

Where the memory device is a synchronous static RAM, the recovery voltages are both high voltages so that the column lines are both driven to high voltages. Where the memory device is a dynamic random access memory, the write recovery voltages are equal to approximately one half of the supply voltage.

DETAILED DESCRIPTION OF THE INVENTION

Figure 2:
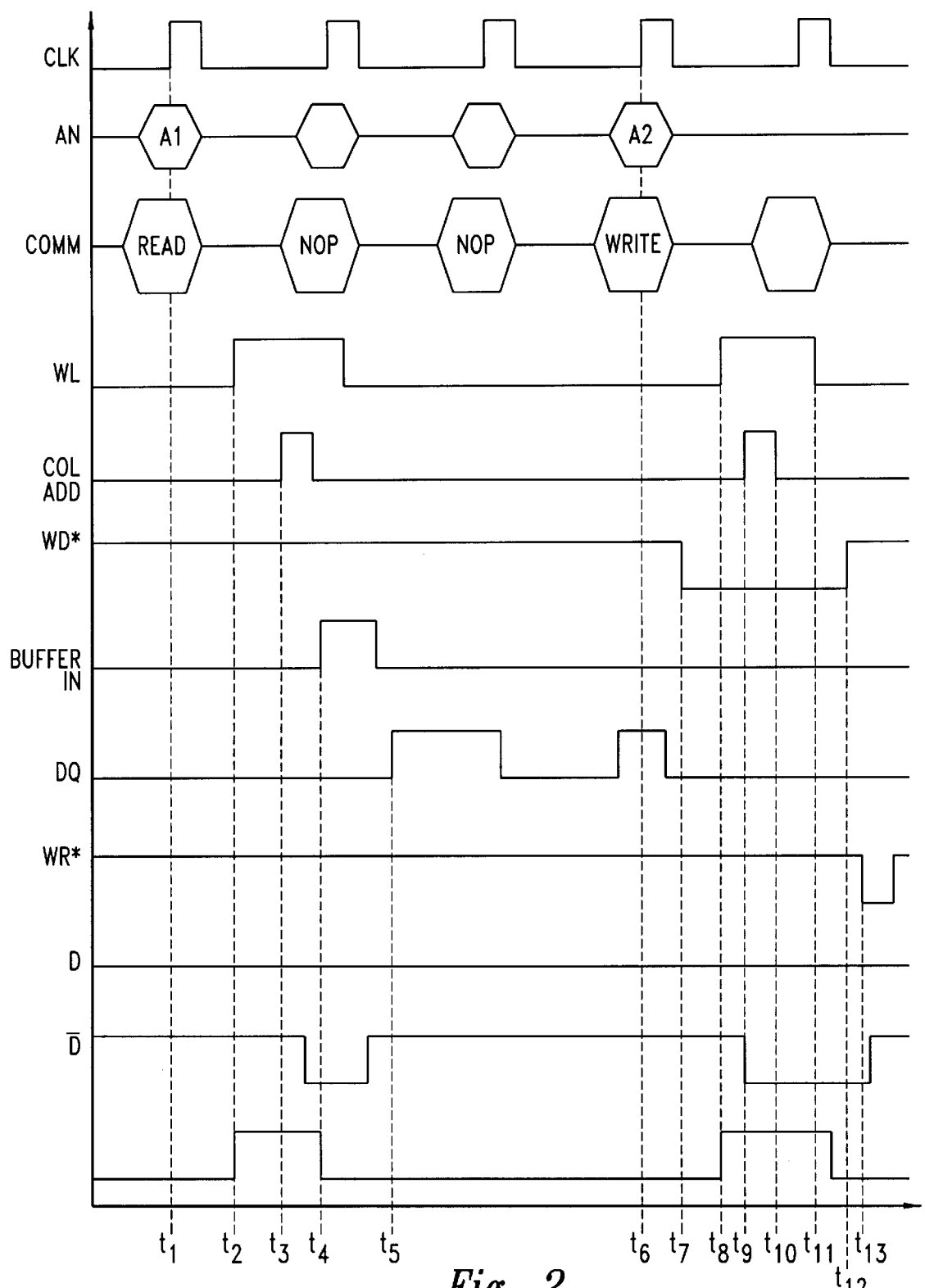
FIG. 2 is a signal timing diagram of selected signals within the device of FIG. 1.
Figure 3:
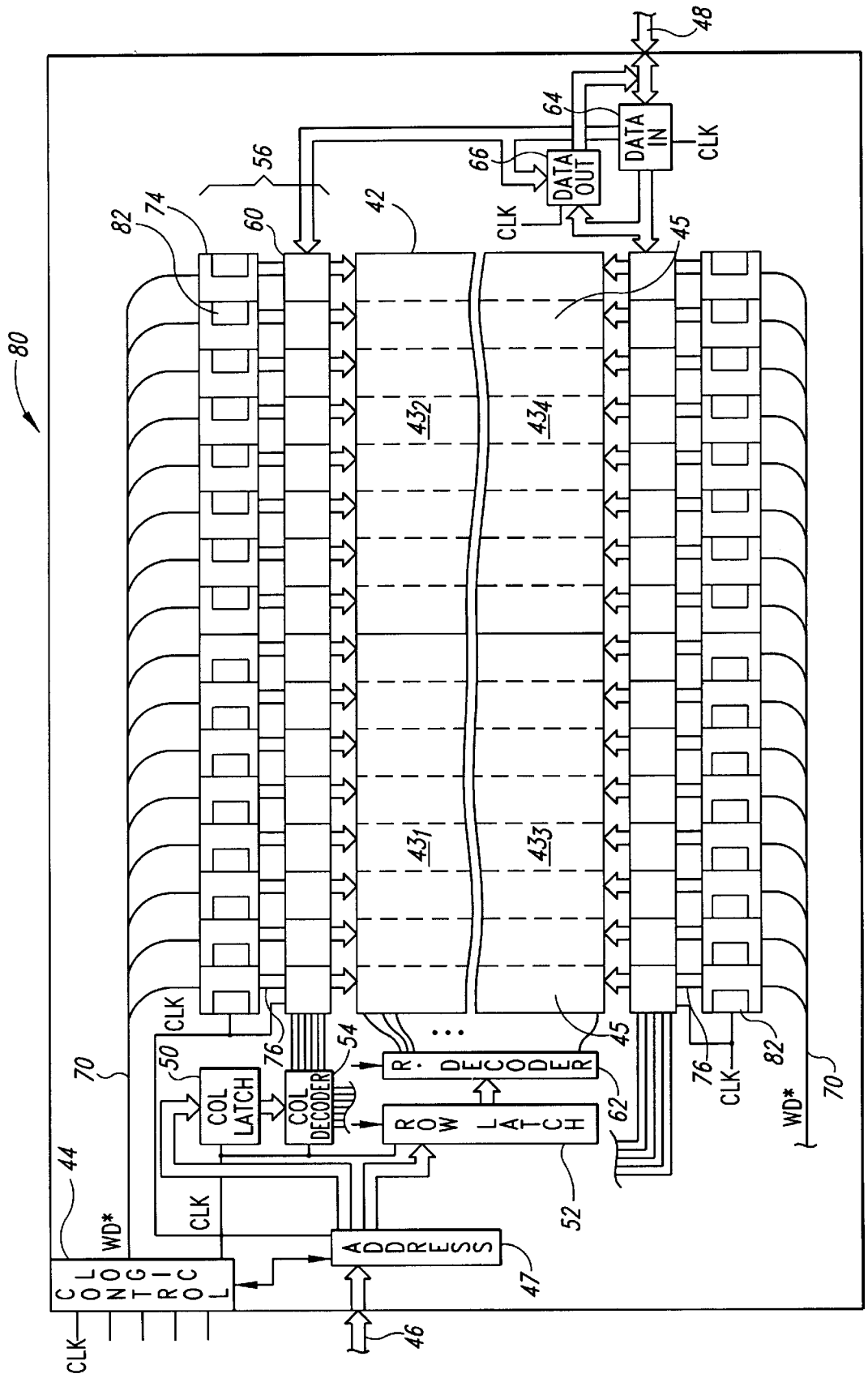
FIG. 3 is a block diagram of a memory device according to the invention including pulse generators within local write drivers.

As shown in FIG. 3, a memory device 80 according to one embodiment of the invention includes many of the elements of the memory device 40 of FIG. 2. Therefore, elements common to both memory devices 40, 80 are numbered the same. Before describing the structure and operation of the memory device 80 in detail, the general theory of operation will be described. Unlike the memory device 40, the memory device 80 does not include the separate write recovery line 72. Instead, each of the driver circuits 74 includes a respective pulse generator 82 that generates a respective local write recovery signal WRLOC* in response to a transition of the write data signal WD* from a true state (low) to a not true state (high). Because the write recovery signal WRLOC* is generated in a region of the substrate nearby the memory array 42, the device 80 eliminates many of the timing problems associated with transmitting a global write recovery signal WR* from the logic controller 44. Also, because the write recovery signal WRLOC* is initiated by a transition of the write data signal WD*, the timing does not need to allow time between writing and the write recovery signal WR* (ie., the delay between times $t_{12}$ and $t_{13}$ in FIG. 2).

Figure 4:
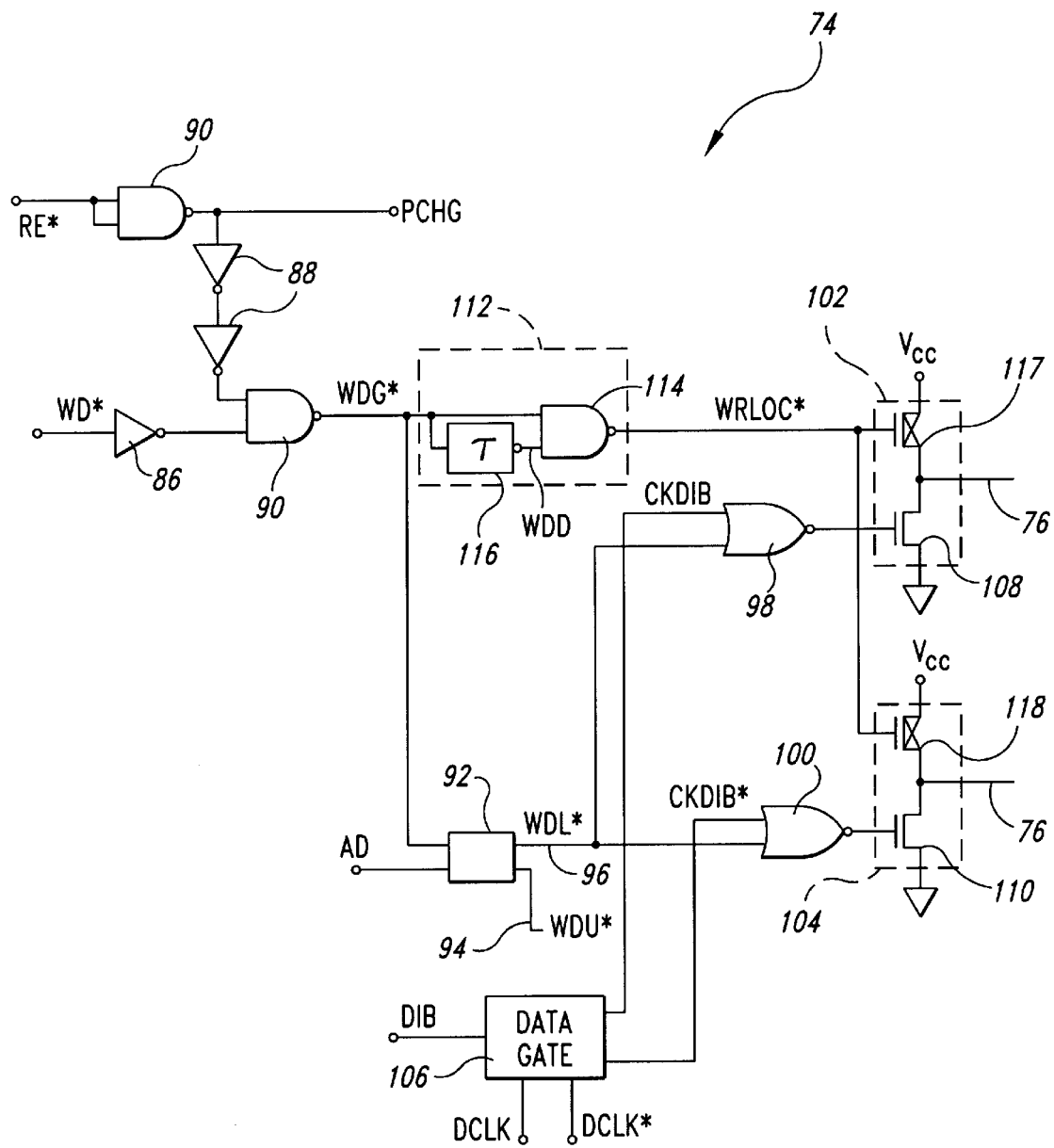
FIG. 4 is a schematic of a portion of a local write driver 74 showing local pulse generation.

The operation of the memory device 80 will now be described with reference to the schematic of FIG. 4 and the signal timing diagram of FIG. 5. FIG. 4 shows one embodiment of the driver circuit 74 for use where the memory device 80 is an SRAM. The local driver circuit 74 operates in response to the write data signal WD* received at an inverter 86, a trigger signal RE* received at a NAND gate 90, data DIB received at a data gate 106, and complementary data clock signals DCLK, DCLK*. As is conventional, the trigger signal RE* is produced in the row decoder 54, and the word line signal WL is derived from the trigger signal RE*, such that the word line signal WL is a slightly delayed, inverted version of the trigger signal RE*, as shown in the third and fourth diagrams of FIG. 5. Thus, the row is active when the trigger signal RE* is true (low).

Figure 5:
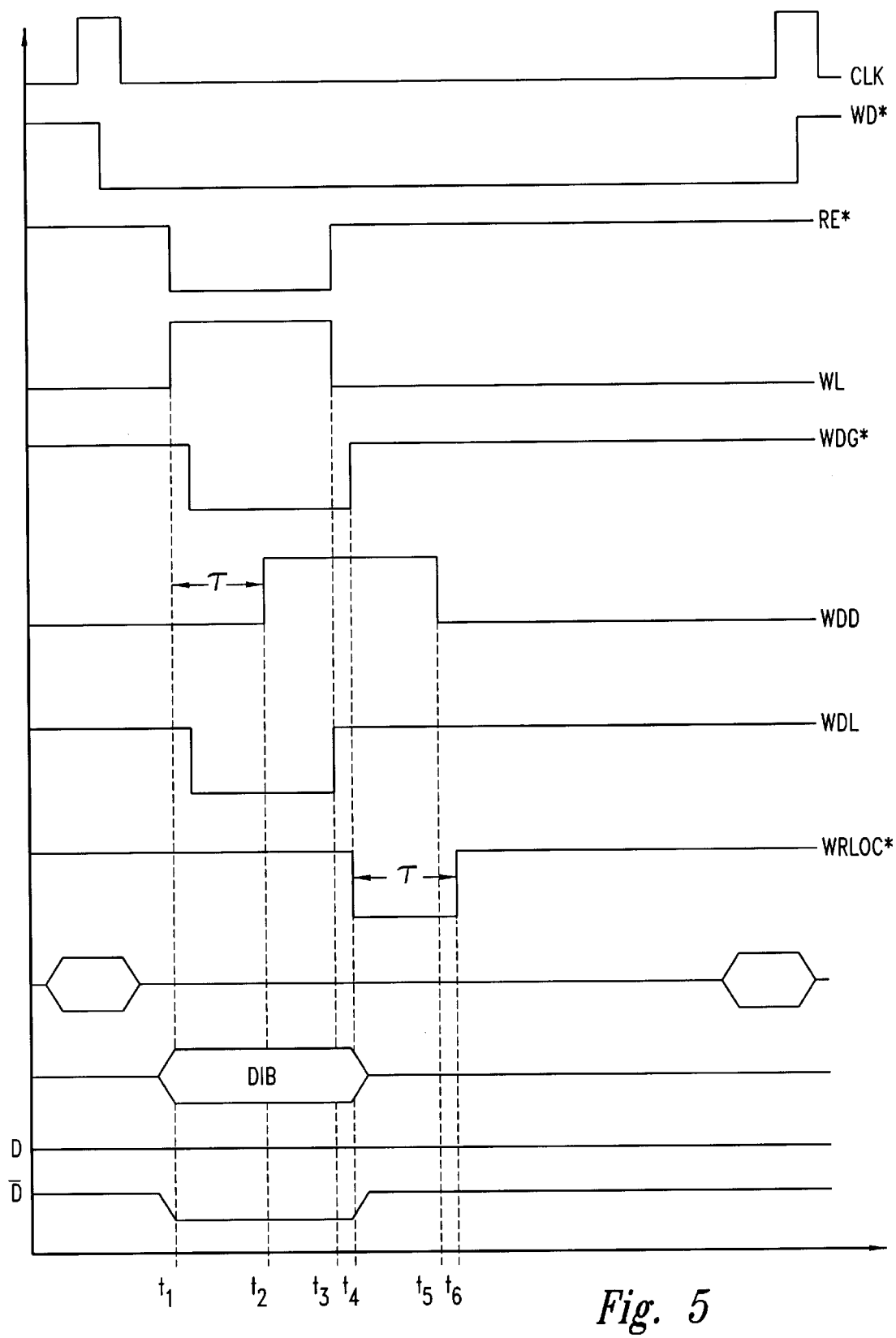
FIG. 5 is a signal timing diagram showing timing of selected signals within the local write driver of FIG. 4.

As shown in the second diagram of FIG. 5, the controller 44 drives the write data signal WD* low slightly after the leading edge of the clock signal CLK and holds the write data signal WD* low for substantially the entire clock period. In response to the low write data signal WD*, the inverter 86 outputs a "1" that is input to enable a NAND gate 90. The second input of the NAND gate 90 receives an inverted version of the trigger signal RE* from a pair of inverters 88 that provide a buffer between the NAND gate 90 and the NAND gate 90. Because the high output from the inverter 86 enables the NAND gate 90 throughout each write operation, the NAND gate 90 outputs a gated trigger signal WDG* that is the same as the trigger signal RE*.

The gated trigger signal WDG* follows two paths from the NAND gate 90. First, the gated trigger signal WDG* is applied to an option select block 92 that also receives a byte option select signal AD indicating whether 8 or 16-bit operation is selected. Depending upon the option select signal AD, the option select circuit 92 transmits the gated trigger signal WDG* either to a lower line 96 as the lower write signal WDL* or to both upper and lower lines 94, 96 as an upper write signal WDU* and a lower write signal VDL*, respectively. The option select circuit 92 thus allows the gated trigger signal WDG* to be applied to one of two separate sets of write lines 76 so that the memory device 80 can be operated as a "by 8" or a "by 16" device by treating each 8 bit byte separately or by combining two 8 bit bytes into a 16 bit byte.

The following description assumes that the 8-bit option is selected and will thus consider only the effect of the lower write signal WDL*. One skilled in the art will recognize that, if 16-bit operation is selected, the upper write signal WDU* will drive similar circuitry to control additional driver lines 76.

The option select circuit 92 provides the lower write signal WDL* on the lower line 96 to inputs of two NOR gates 98, 100 that each drive a respective output driver 102, 104. The remaining inputs to the NOR gates 98, 100 are driven by complementary clocked data signals CKDIB, CKDIB* from a data gate 106. The data gate 106 outputs the clocked data signals CKDIB, CKDIB* in response to data DIB from the input data register 64 (FIG. 4) and the complementary data clock signals DCLK, DCLK*. The data signals CKDIB, CKDIB* are the complement of each other, CKDIB corresponds to DIB. Thus, when the data clock signals DCLK, DCLK* go active, CKDIB is set to DIB and CKDIB* is set to the complement of DIB.

When the write data signal WD* is true (low) and the byte is selected, the lower write data signal WDL* is true (low). The true lower write data signal WDL* enables the NOR gates 98, 100 so that the NOR gates 98, 100 will output the complement of the data signals CKDIB, CKDIB*, respectively. The output of the NOR gates 98, 100 are thus complementary clocked versions of the input data DIB when the 8-bit byte option is selected, the write data signal WD* is low, and the trigger signal RE* is low.

Figure 1:
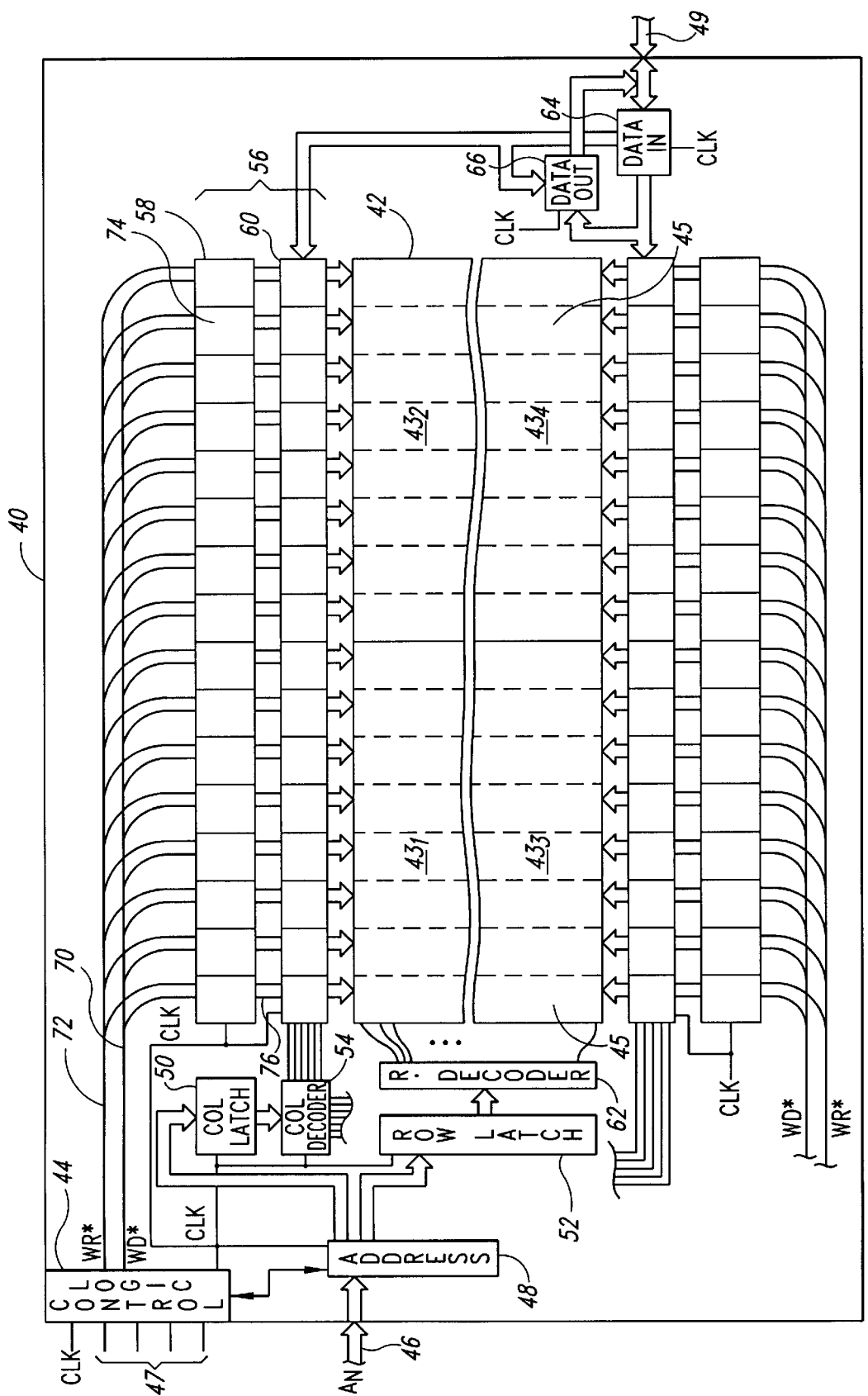
FIG. 1 is a block diagram of a prior art memory device.

The outputs of the NOR gates 98, 100 drive their respective output drivers 102, 104, which, in turn, drive respective data to lines 76, 76*. In the output drivers 102, 104, NMOS transistors 108, 110 couple their respective data lines 76, 76* to ground when the respective clocked data signals CKDIB, CKDIB* are low (i.e., the output of the respective NOR gate 98, 100 is high). However, since CKDIB and CKDIB* are complementary, only one NMOS transistor 108, 110 will be ON at any time. The driving circuit 74 thus drives the corresponding write lines 76, 76* with complementary clocked data CKDIB, CKDIB* from the data register 64 when the trigger signal RE* transitions low. As described above with respect to FIG. 1, the data on the data lines 76, 76* is coupled to a respective digit line pair in the memory array 42 by the column select circuit 60. A data bit corresponding to CKDIB, CKDIB* is then written to a selected cell in the memory array 42 because the appropriate row line is already active, as noted above.

When the trigger signal RE* becomes not true (i e., returns from low to high), the gated write signal WDG* goes high, causing the lower write signal WDL* to go not true (high). The high lower write signal WDL* causes the NOR gates 98, 100 to output low signals, thereby turning OFF the NMOS transistors 108, 110. The high trigger signal RE* thus blocks the clocked data CKDIB, CKDIB* from reaching the data lines 76, 76*.

In addition to controlling data flow to the data lines 76, 76*, the gated write signal WDG* also drives a trailing edge detector 112 formed from a NAND gate 114 and a delay circuit 116. When the trigger signal RE* becomes true (goes from high to low) at time $t_1$, the gated write signal WDG* drives the first input to the NAND gate 114 low almost immediately. The delay circuit 116 drives the second input of the NAND gate 114 with a delayed gated signal WDD that is a delayed, inverted version of the gated write signal WDG*, as shown in the sixth diagram of FIG. 5. The delayed signal WDD transitions from low to high at time $t_2$ in response to the low-going transition of the trigger signal RE* at time $t_1$. The high-going delayed signal WDD does not affect the output of the NAND gate 114, because the first input to the NAND gate 114 is already low. Consequently, the low-going transition of the trigger signal RE* does not affect the output of the NAND gate 114.

At the end of writing, the trigger signal RE* transitions from low to high to block data flow to the data lines 76, 76*, as described above. In response, the gated write signal WDG* drives the first input to the NAND gate 114 high at time $t_3$. At this point, both inputs to the NAND gate 114 are high, so the output of the NAND gate 114 transitions low at time $t_4$, just after time $t_3$, as shown in the seventh diagram of FIG. 5. After the delay period $\tau$, the delayed signal WDD returns low at time $t_5$, thereby driving the second input to the NAND gate low. The NAND gate 114 output returns high at time $t_6$ in response. Thus, the NAND gate 114 outputs a low-going pulse upon low-to-high transitions of the trigger signal RE* to form a local write recovery signal WRLOC*.

The low-going pulse of the local write recovery signal WRLOC* drives the gates of PMOS transistors 117, 118 in the output drivers 102, 104 to briefly couple the data lines 76, 76* to the supply voltage $V_{CC}$. The NMOS transistors 108, 110 are OFF at this point, because the trigger signal RE* is high as discussed above. Therefore, the PMOS transistors 117, 168 briefly pull both of the data lines 76, 76* high.

As mentioned above, the clocked data signals CKDIB, CKDIB* are complementary so that only one of the clocked data signals CKDIB, CKDIB* will go low during each write operation. The clocked data signal that is driven low will cause its respective NOR gate 98 or 100 to turn ON its respective transistor 108, 110, respectively, thereby driving one of the data lines 76 or 76* low. The other NOR gate 98 or 100 will output a low so that its respective transistor 108 or 110 remains OFF. As a result, the data line 76 or 76* coupled to the OFF transistor 108 or 110, respectively, will remain high.

The column selector 60 couples the high voltages of the data lines 76, 76* to the addressed column lines of the array 42, thereby raising the column lines to the supply voltage Vcc to prepare the digit lines for reading or writing data. The local generation of the write recovery signal WRLOC* eliminates much of the delay associated with the device 90 of FIG. 1, because the write recovery signal WRLOC* precharges the column lines in response to the trigger signal RE* ending the writing period. Consequently, the write recovery signal WRLOC* initiates precharging of the column lines even while the write data signal WD* is still true. The controller 44 therefore does not have to allot a separate time period for write recovery after the writing period ends.

In the embodiment of FIG. 4, the column line voltages are both returned to $V_{CC}$ because the device is a static RAM. One skilled in the art will recognize that the driver circuit 58 can be adapted to provide other voltages. For example, to prepare the digit lines for reading in a dynamic RAM (DRAM), the local write recovery pulse WRLOC* would couple the digit lines to a precharge voltage DVC2 which is typically equal to $V_{CC}/2$.

Figure 6:
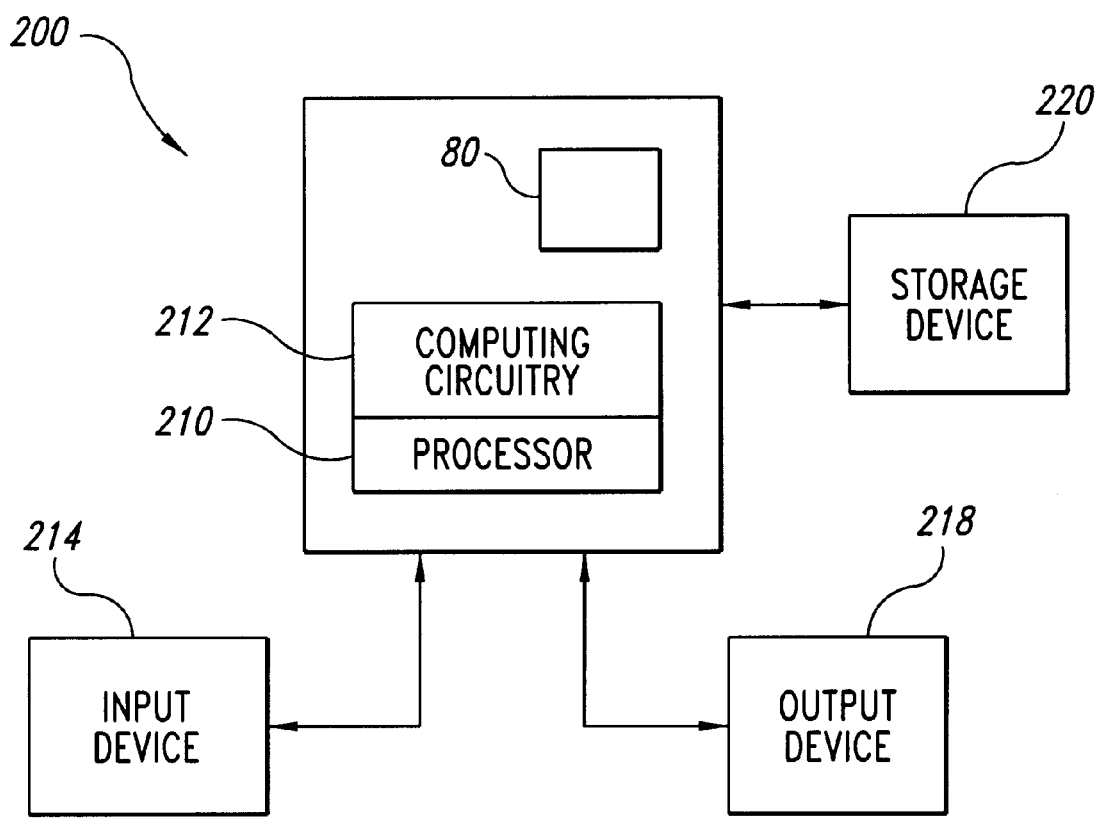
FIG. 6 is a block diagram of a computer system including the memory device of FIG. 3.

FIG. 6 is a block diagram of a computer system 200 that uses the memory device 80, including the driver circuit 58 of FIG. 4. The computer system 200 includes a processor 210 and related computing circuitry 212 for performing computer functions, such as executing software to perform desired calculations and tasks. One or more input devices 214, such as a keypad or a mouse, are coupled to the processor 210 and allow an operator (not shown) to manually input data thereto. One or more output devices 218 are coupled to the processor to provide to the operator data generated by the processor 210. Examples of output devices 218 include a printer and a video display unit. One or more mass data storage devices 220 are preferably coupled to the processor 210 to store data in or retrieve from the storage device 220. Examples of storage devices 220 include disk drives and compact disk read only memories (CD-ROMs).

From the foregoing it will be appreciated that, although specific embodiments of the invention have been described herein for purposes of illustration, various modifications may be made without deviating from the spirit and scope of the invention. For example, the principles herein may be applied to dynamic random access memories (DRAMs) as noted herein. One skilled in the art will also recognize that complementary devices (e.g., replacing NAND gates with NOR gates and vice versa) can be employed to perform the functions described herein. Further, a variety of other local pulse generators may be used to identify the end of the writing interval. Additionally, the output of the local pulse generator may be applied to each individual digit line or may be applied to a group of write lines. Accordingly, the invention is not limited except as by the appended claims.

I claim:

1. A memory device, comprising:
    a controller having an input terminal adapted to receive commands and an output terminal, the controller being responsive to the commands to produce a set of command signal at the output terminal, the command signals including a write enable signal having a first logic state correspondence to writing data to a memory array and a second logic state correspondence to not writing data to the memory array;
    the memory array divided into a plurality of memory sections, each memory section including a plurality of complementary digit line pairs;
    a plurality of digit line drivers each corresponding to a respective memory section, each digit line driver including a write enable input coupled to the controller and adapted to receive the write enable signal, a data input adapted to receive a data signal, and a data output coupled to at least one complementary digit line pair in the memory section, each digit line driver being responsive to the write enable signal of the first logic state at the write enable input terminal and the data signal at the data input to establish respective voltages on the at least one digit line pair corresponding to the data signal; and
    a plurality of reset pulse generators each corresponding to a respective memory section and each having an output coupled to at least one complementary digit line pair in the memory section, each reset pulse generator having a trigger input coupled to the output terminal of the controller and being responsive to a transition of the write enable signal from the first logic state to the second logic state to drive the at least one complementary digit line pair to predetermined voltages.

2. The memory device of claim 1, further comprising a plurality of enable lines, each coupled between the output terminal at the controller and a write enable input of a respective digit line driver.

3. The memory device of claim 1 wherein each reset pulse generator includes a transition detector having a detector input coupled to the trigger input and a detector output coupled to the at least one complementary digit line pair, the transition detector being operative to produce a pulse at the detector output in response to the transition of the write enable signal from the first logic state to the second logic state.

4. The memory device of claim 3 wherein each reset pulse generator further includes:
    a precharge voltage terminal configured to provide a precharge voltage; and
    a first switch coupled between a first voltage and a first digit line of the at least one digit line pair, the first switch including a first control input coupled to the transition detector output, the first switch being responsive to the pulse to apply a first voltage to the first digit line.

5. The memory device of claim 4 wherein each reset pulse generator further includes:
    a second switch coupled between the first voltage and a second of the at least one digit line pair, the second switch including a second control input coupled to the transition detector output, the second switch being responsive to the pulse to apply the first voltage to the second digit line.

6. An integrated memory device, comprising:
    a substrate;
    a first plurality of memory cells integrated on the substrate in a first region and responsive to accept write data in response to a first write enable signal;
    a second plurality of memory cells integrated on the substrate in a second region and responsive to accept write data in response to a second write enable signal;
    a control circuit integrated on the substrate in a third region separate from the first and second regions, the control circuit including a writing circuit that produces a trigger signal of a first logic state to enable writing of data to the memory cells in the first or second pluralities of memory cells and of a second state to disable writing of data to the cells in the first and second pluralities of cells;
    a first local write driver circuit adjacent to the first region, the first write driver circuit having an output coupled to the first plurality of memory cells, the first write driver circuit including an input coupled to the control circuit to receive the trigger signal, the first write driver circuit being configured to provide the first write enable signal to the first plurality of cells in response to the trigger signal of the first state, the first local write driver further including a first pulse generator having a trailing edge detector coupled to receive the respective trigger signal, the trailing edge detector being configured to detect transitions of the trigger signal from the first state to the second state and to produce a first reset pulse in response thereto; and
    a second local write driver circuit adjacent to the second region, the second write driver circuit having an output coupled to the second plurality of memory cells, the second write driver circuit including an input coupled to the control circuit to receive the trigger signal, the second write driver circuit being configured to provide the second write enable signal to the second plurality of cells in response to the trigger signal of the first state, the second local write driver further including a first pulse generator having a trailing edge detector coupled to receive the respective trigger signal, the trailing edge detector being configured to detect transitions of the trigger signal from the first state to the second state and to produce a second reset pulse in response thereto.

7. The memory device of claim 6, further comprising:

a first signal line extending from the control circuit to the first local write driver; and a second signal line extending from the control circuit to the second local write driver.

8. The memory device of claim 6 wherein each of the first and second write drivers includes a respective data input and a respective output driver, each output driver including a switching input coupled to the data input and a reset input coupled to the respective transition detector.

9. The memory device of claim 8 wherein each of the first and second write drivers includes a gating circuit coupled between the data input and the switching input, the gating circuit including a respective clock input and being responsive to selective transmit or block data from passing from the data input to the switching input in response to a clock signal at the clock input, further comprising:

a system clock coupled to the clock inputs; and a data register coupled to the respective data inputs.

10. A memory device, comprising:

a control circuit configured to receive commands and to output trigger signals in response thereto;

a memory array including a plurality of memory sections;

a plurality of local write drivers, each having a pair of driver outputs coupled to a respective memory block, and a write enable input coupled to the control circuit to receive the trigger signals, each responsive to the trigger signals and a data input to provide complementary data signals at the driver outputs;

a plurality of pulse generators, each within a respective one of the write drivers, each pulse generator having a generator input coupled to the write enable input and a generator output coupled to the driver outputs, and each pulse generator being responsive to termination of the trigger signal to provide recovery pulses at the generator output; and a plurality of complementary digit line pairs, each digit line pair being located in a separate one of the memory sections, each of the digit line pair being coupled to respective driver outputs of a respective one of the local write drivers.

11. The memory device of claim 10 wherein each of the pulse generators includes a transition detector including:

a delay circuit having a delay input coupled to the generator output and a delay output; and a logic gate having a first input coupled to the generator output and a second input coupled to the delay output.

12. A local write driver for a memory device, responsive to drive a complementary pair of digit lines in response to first or second input signals, comprising:

an input terminal adapted to receive the input signals;

a first voltage terminal adapted to receive a first voltage;

a first pair of switches, each coupled between a respective one of the complementary digit lines and the first voltage terminal, each of the switches in the first pair having a respective control input coupled to the input terminal and responsive to the first or second input signal at the respective control input to couple the respective complementary digit line to the first voltage;

a transition detector having an output terminal, the transition detector including a logic gate having a first input coupled to the input terminal along a first path and a second input coupled to the input terminal along a second path wherein the second path includes a delay, the transition detector being operative to produce an output signal at the output terminal in response to a transition of the input signal;

a second voltage terminal adapted to receive a second voltage; and a second pair of switches each coupled between a respective one of the complementary digit lines and the second voltage terminal, each of the switches in the second pair having switching inputs coupled to the output terminal of the transition detector, each of the switches in the second pair being responsive to the output signal to selectively couple the respective complementary digit line to the second voltage terminal.

13. The local write driver of claim 12 wherein the first voltage is a reference voltage and the second voltage is a supply voltage, wherein the switches in the first and second pairs of switches are transistors.

14. The local write driver of claim 12, further including a gating circuit having a gating input, a signal input coupled to the input terminal, and a signal output coupled to the control inputs of the switches in the first pair and the first and second inputs of the transition detector, the gating circuit being responsive to a gating signal at the gating input to selectively block or transmit the input signal from the signal input to the signal output.

15. A computer system, comprising:

a central processor;

an input device coupled to the central processor;

an output device coupled to the central processor;

a mass storage device coupled to the central processor; and a memory device coupled to the controller, the memory device including:

a controller having a command input coupled to the central processor for receiving commands and an output, the controller being responsive to the commands to produce a set of command signals, including a write control signal having an enable portion of a first logic state and a disable portion of a second logic state;

data terminals configured to receive data signals;

a memory array divided into a plurality of memory sections, each memory section including a plurality of complementary digit line pairs;

a plurality of digit line drivers each corresponding to a respective memory section, each digit line driver being coupled to the at least one complementary digit line pair in the respective memory section, each digit line driver including a write enable input coupled to the controller, a data input coupled to the data terminals, and data outputs coupled to the at least one digit line pair, each digit line driver being responsive to the enable portion at the write enable input and the data signal at the data input to establish relative voltages of the digit line pair corresponding to the data signal; and a plurality of reset pulse generators, each corresponding to a respective one of the digit line drivers, each reset pulse generator having a pulse output coupled to the corresponding complementary digit line pair, each reset pulse generator having a disable input and being responsive to the disable portion to couple a predetermined voltage to the digit line pair.

16. The computer system of claim 15 wherein the memory device further includes a plurality of enable lines, each coupled between the control logic portion and a respective write enable input of a respective write driver.

17. The computer system of claim 15 wherein each reset pulse generator includes a transition detector having a transition detector input and a transition detector output, the transition detector input being coupled to the disable input and operative to produce a pulse in response to transitions of the write control signal.

18. The computer system of claim 17 wherein each reset pulse generator further includes:
   a voltage source that provides the predetermined voltage; and
   a switch coupled between the voltage source and a first of the digit lines in the complementary digit line pair, the switch including a control input coupled to the transition detector output and operative to provide the predetermined voltage to the first complementary digit line in response to the pulse.

19. A method of reading data in a synchronous memory device having a controller, a memory array including a plurality of memory sections each containing a plurality of complementary digit line pairs, and a plurality of driver circuits, each corresponding to a respective memory section, comprising the steps of:
   generating a trigger signal at the controller;
   transmitting the trigger signal from the controller to the driver circuits;
   detecting the trigger signal at the driver circuits;
   writing data to the memory array in response to the trigger signal;
   terminating the trigger signal at the controller;
   at each of the driver circuits, detecting termination of the trigger signal;
   at least one of the driver circuits generating a write recovery signal in response to the detected termination of the trigger signal;
   producing a pair of line voltages in response to the write recovery signal; and
   coupling the line voltages to at least one digit line pair.

20. The method of claim 19 wherein the write recovery signal is a pulse.

21. The method of claim 19 wherein the step of writing data to the memory array includes applying complementary voltages to the digit line pair and the step of producing a pair of line voltages includes producing both of the line voltages substantially equal to a supply voltage.

22. A method of writing data to a memory array with a plurality of local write drivers having activation inputs coupled to a memory control circuit and line outputs coupled to respective lines of the memory array, the method comprising the steps of:
   initiating a write operation at the memory control circuit;
   activating one or more of the local write drivers in response to initiating the write operation;
   after a write interval, deactivating the one or more local write drivers;
   detecting the end of the selected write interval at the one or more local write drivers;
   in response to the detected end of the write interval, producing a local write recovery pulse; and
   resetting a voltage of a respective line in response to the write recovery pulse.

23. The method of claim 22 wherein the step of activating one or more local write drivers includes the step of providing a trigger signal of a first state to the local write driver and the step of detecting the end of the selected write interval includes detecting a transition of the trigger signal from the first state to a second state.

24. The method of claim 22 wherein the step of resetting the voltage of the respective line in response to the write recovery pulse includes the step of resetting a plurality of lines.

25. The method of claim 24 wherein the step of resetting a plurality of lines comprises resetting a pair of digit lines in a memory array.

* * * * *